United States Patent
Palmer et al.

(10) Patent No.: US 11,989,456 B2
(45) Date of Patent: May 21, 2024

(54) MOBILE STORAGE RANDOM READ PERFORMANCE ESTIMATION ENHANCEMENTS

(71) Applicant: Micron Technology, Inc., Boise, ID (US)

(72) Inventors: David Aaron Palmer, Boise, ID (US); Xinghui Duan, Shanghai (CN); Massimo Zucchinali, Torre Boldone (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/771,668

(22) PCT Filed: Dec. 31, 2019

(86) PCT No.: PCT/CN2019/130363
§ 371 (c)(1),
(2) Date: Apr. 25, 2022

(87) PCT Pub. No.: WO2021/134414
PCT Pub. Date: Jul. 8, 2021

(65) Prior Publication Data
US 2022/0382487 A1    Dec. 1, 2022

(51) Int. Cl.
*G06F 12/00* (2006.01)
*G06F 3/06* (2006.01)
*G06F 12/02* (2006.01)

(52) U.S. Cl.
CPC .......... *G06F 3/0659* (2013.01); *G06F 3/0604* (2013.01); *G06F 3/0679* (2013.01); *G06F 12/0246* (2013.01); *G06F 2212/7202* (2013.01)

(58) Field of Classification Search
CPC .... G06F 3/0659; G06F 3/0604; G06F 3/0679; G06F 12/0246; G06F 2212/7202;
(Continued)

(56) References Cited

U.S. PATENT DOCUMENTS 8,804,418 B1 *   8/2014   Shih .................... G11C 16/349
                                                    365/185.24
9,628,561 B1 *   4/2017   Kulkarni ............. G06F 11/1464
(Continued)

FOREIGN PATENT DOCUMENTS

| CN | 114902337 | 8/2022 |
| JP | H0465146 A | 3/1992 |
| WO | WO-2021134414 A1 | 7/2021 |

OTHER PUBLICATIONS

"International Application Serial No. PCT/CN2019/130363, International Search Report dated Aug. 28, 2020", 5 pgs.
(Continued)

*Primary Examiner* — Shawn X Gu
*Assistant Examiner* — Mohammad S Hasan
(74) *Attorney, Agent, or Firm* — Schwegman Lundberg & Woessner, P.A.

(57) ABSTRACT

A computing system (100) having a storage system that includes a storage device (130) and a host device (105), where the host device (105) is configured to issue memory access commands to the storage device (130). The computing system (100) further includes a prediction system (190) comprising processing circuitry that is configured to perform operations that cause the prediction system (190) to identify one or more components of the storage system (918) that limit random rad performance of the storage system (918). The operations further cause the prediction system (190) to obtain characterization data that is indicative of the impact of the one or more components on random read performance and generate a model based on the characterization data to predict random read performance of the storage system (918). The operations additionally cause the prediction system (190) to execute the model in a simulation of the storage
(Continued)

system (918) to generate a random read performance parameter for the storage system (918).

20 Claims, 9 Drawing Sheets

(58) Field of Classification Search
CPC ......... G06F 30/3308; G06F 2212/1024; G06F 2212/7201; G06F 2212/7203; G06F 2212/7206; G11C 16/0483; Y02D 10/00
See application file for complete search history.

(56) References Cited

U.S. PATENT DOCUMENTS

| | | | | |
|---|---|---|---|---|
| 10,509,739 | B1* | 12/2019 | Gudipati | G06F 9/3851 |
| 2005/0005059 | A1* | 1/2005 | Tanaka | G06F 12/0246 |
| | | | | 711/170 |
| 2007/0263462 | A1* | 11/2007 | Roohparvar | G11C 16/0483 |
| | | | | 365/198 |
| 2008/0177978 | A1* | 7/2008 | Karamcheti | G06F 13/1657 |
| | | | | 711/E12.059 |
| 2008/0201341 | A1* | 8/2008 | Okamoto | H04N 21/2393 |
| 2008/0221854 | A1 | 9/2008 | Arimoto et al. | |
| 2009/0119477 | A1* | 5/2009 | Plondke | G06F 12/1027 |
| | | | | 711/E12.002 |
| 2010/0205371 | A1* | 8/2010 | Tanaka | G06F 11/3452 |
| | | | | 711/E12.001 |
| 2011/0035540 | A1* | 2/2011 | Fitzgerald | G06F 3/0688 |
| | | | | 711/E12.001 |
| 2011/0295403 | A1 | 12/2011 | Higuchi et al. | |
| 2013/0019080 | A1* | 1/2013 | Levinsky | G06F 12/1027 |
| | | | | 711/206 |
| 2014/0025770 | A1* | 1/2014 | Warfield | G06F 16/256 |
| | | | | 709/213 |
| 2015/0032936 | A1* | 1/2015 | Yu | G06F 12/0246 |
| | | | | 711/158 |
| 2015/0078094 | A1* | 3/2015 | Nagashima | G11C 29/42 |
| | | | | 365/185.21 |
| 2015/0177994 | A1* | 6/2015 | Vucinic | G06F 12/08 |
| | | | | 711/103 |
| 2017/0206024 | A1* | 7/2017 | Rezaei | G06F 3/0611 |
| 2017/0249206 | A1 | 8/2017 | Jeong et al. | |
| 2019/0065387 | A1* | 2/2019 | Duzly | G06F 12/0246 |
| 2019/0278500 | A1* | 9/2019 | Lakshmi | G06F 3/0688 |
| 2020/0293439 | A1* | 9/2020 | Kodama | G06F 13/385 |
| 2020/0326868 | A1* | 10/2020 | Yang | G06F 3/0604 |
| 2020/0333978 | A1* | 10/2020 | Arnold | G06F 3/067 |
| 2020/0401323 | A1* | 12/2020 | Gade | G06F 3/065 |
| 2020/0409852 | A1* | 12/2020 | Benisty | G06F 3/0673 |
| 2021/0149583 | A1* | 5/2021 | Agarwal | G06F 3/064 |

OTHER PUBLICATIONS

"International Application Serial No. PCT/CN2019/130363, Written Opinion dated Aug. 28, 2020", 4 pgs.
"International Application Serial No. PCT CN2019 130363, International Preliminary Report on Patentability dated Jul. 14, 2022", 5 pgs.

* cited by examiner

| Die count | QD1 | QD2 | QD4 | QD8 | QD16 | QD32 |
|---|---|---|---|---|---|---|
| 2 | 50.0% | 74.9% | 93.7% | 99.6% | 99.9% | 100% |
| 4 | 25.0% | 43.7% | 68.3% | 89.9% | 98.9% | 99.9% |
| 8 | 12.5% | 23.4% | 41.3% | 65.6% | 88.1% | 98.6% |

| Topology | No MPR | MPR | Speedup |
|---|---|---|---|
| 2 die QD8 | 35.5 | 50.2 | 41.5% |
| 4 die QD8 | 61.6 | 75.2 | 22.2% |
| 8 die QD8 | 91.8 | 99.3 | 8.1% |
| 2 die QD32 | 37.3 | 59.6 | 59.9% |
| 4 die QD32 | 72.3 | 111.4 | 54.2% |
| 8 die QD32 | 134.8 | 187.8 | 39.3% |

MOBILE STORAGE RANDOM READ PERFORMANCE ESTIMATION ENHANCEMENTS

PRIORITY APPLICATION

This application is a U.S. National Stage Application under 35 U.S.C. 371 from International Application No. PCT/CN2019/130363, filed 31 Dec. 2019, published as WO 2021/134414, which is incorporated herein by reference in its entirety.

TECHNICAL FIELD

Embodiments of the present disclosure relate generally to computer storage systems, more particularly, but not by way of limitation, to random read performance estimation in systems that include array-based storage devices.

BACKGROUND

Computer data storage systems (hereinafter, "storage systems") can use one or more data storage devices to store or retrieve data that is generated or operated on by host computing systems. Such storage devices can include one or more storage controllers that use a combination of firmware and hardware components to facilitate the movement of data between a host computing system and storage media associated with the storage devices. The storage controller can operate as an interface between the host computing system storage media. In an example the storage media includes one or more semiconductor memory arrays. A memory army can include volatile or non-volatile memory. Volatile memory can include one or more semiconductor circuits that require power to maintain stored data. In an example, Volatile memory includes circuits or devices such as random-access memory (RAM), static random-access memory (SRAM), dynamic random-access memory (DRAM), or synchronous dynamic random-access memory (SDRAM), among others. Non-volatile memory can include one or more semiconductor circuits that are configured to maintain stored data when not powered. In an example, non-volatile memory includes circuits or devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magneto-resistive random-access memory (MRAM), and 3D-Xpoint memory, among others.

In operation, a storage system can receive memory access commands from a host computing system. The memory access commands can be issued by an operating system or a software application executing on the host computing system. The memory access commands can include instructions to read data from, or to write data to, a storage device at one or more logical address. The storage device can process these instructions by translating the logical address to physical address and use the translated addresses to access memory at specific physical locations in a memory array.

Random read input operations per second (IOPs) is a useful metric for measuring the performance of storage devices or systems that incorporate storage devices. Random read operations issued to an array-based storage device include operations to read data from an arbitrary location in a memory array. Predicting the in-situ random read IOPs of an array-based storage device, such as by modeling or simulating, can be challenging.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various examples discussed in the present document.

DETAILED DESCRIPTION

Figure 1:
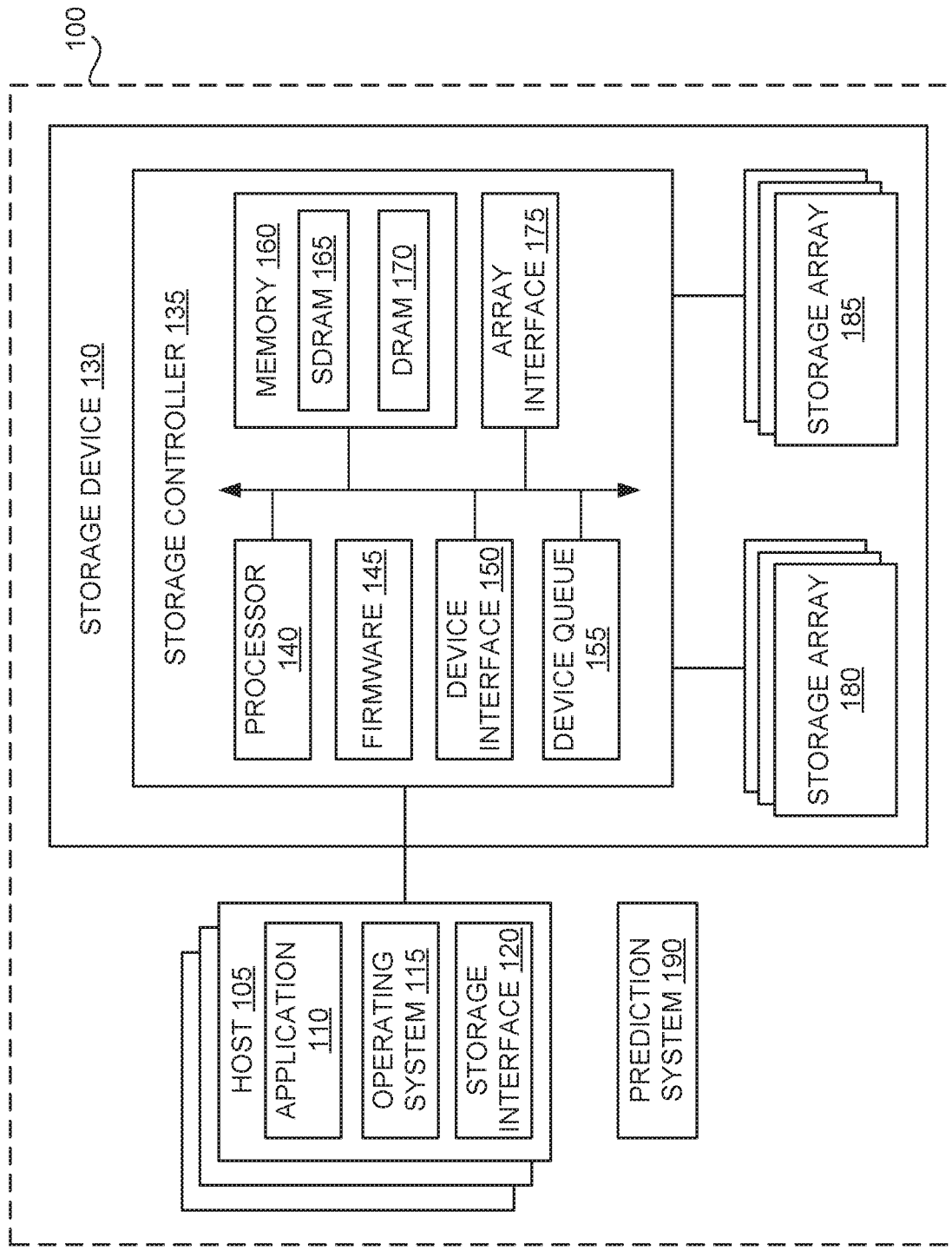
FIG. 1 illustrates a computing system, in accordance with examples of the present disclosure.

Aspects of the present disclosure are directed to random read prediction or estimation in computing systems that include array-based storage devices. Such predictions can be used to determine the performance of a computing system based on the capabilities of an array-based storage device and one or more components of the computing system. Such predictions can also be used to evaluate the impact that one or more components of the computing system on the random read performance of the system.

As used herein, an array-based storage device includes storage devices where the storage media includes one or more die having arrays of semiconductor storage cells (hereinafter, "storage array"). In an example, a storage array can include NAND storage media (hereinafter, "NAND device"), such as a NAND die or an array of NAND storage cells. The number of random read operations serviced per second (IOPs) by a computing system that is configured with a particular array-based storage device is a useful metric, or performance measurement, for characterizing the data read performance of the computing system. This metric is largely dependent on the time it takes to read a random data block, or string, from a storage array. This array read time or, indirectly, the device level IOPs, can be obtained from the manufacture of the storage device or storage array, such as by reviewing the technical specification associated with the storage device or storage array. Converting array read time into IOPs as viewed from the perspective of a host system (hereinafter, "host IOPs") is complicated by the fact that array-based storage devices are typically used in resource constrained environments, such as in systems where a number of interrelated factors (e.g., resource limitations) interact with the device IOPs to determine the actual random read performance obtained at a host device.

In an example, a storage device can receive, from a host computing system over a front-end communication bus, a random read command, such as a command to read, or retrieve, a targeted block of memory (hereinafter, "data block") from a storage array (e.g., a NAND die). The targeted data block is typically specified in terms of a host logical block address (LBA), such as determined by an operating system executing on the host device. The storage device can translate the LBA to a physical address (PA) and use the physical address to locate the targeted data block in the storage array. The storage device can retrieve the targeted data block by using the physical address to actuate the storage array to read (e.g., sense) and transfer the data block to the storage device using a backend communication bus, such as an open NAND flash interface communication channel.

Techniques for estimating or predicting the random read performance of computing systems of array-based storage devices assume that the largest component of the random read latency is array read time and the time it takes to transfer a block of data from a storage day to a storage device (e.g., to a buffer in a controller of the storage device). Random read latency includes the difference in time between the time at which a host device issues a random read command and the time at which the host device receives a requested data block. According to these techniques, random read performance is estimated as a product of the number of storage arrays that can be concurrently accessed (e.g., die count) by a storage device and the reciprocal of the sum of the array read time and the time is takes to transfer the block of data to the storage device. These techniques, however, fail to account for the impact of host system and storage device resource constraints on RR performance.

Examples of the present disclosure are based on the realization that the accuracy of predicting random read performance of a computing system can be improved by incorporating the capabilities of the storage medias (e.g., the capabilities of the storage array) along with elements, or aspects, of a computing system that operate to improve or limit the utilization of the storage media, into the prediction methodology. Accordingly, examples of the present disclosure include techniques for predicting random read performance of computing systems that utilize array-based storage devices. Such techniques include improved existing prediction techniques by incorporating the capabilities or architecture of the storage media used by the storage devices and one or more system elements of the system that operate to limit or improve random read performance into the prediction. Such system elements can include characterization data such as storage array utilization rate, front-end or back-end communication channel contention, parallelism features of the storage array, storage device logical to physical address translation cache, storage device firmware overhead, and host system overhead. The impact that each of these elements have on system random read performance can be characterized though modeling or experimentation. Data that is indicative of this impact or the effect of each of these elements can then combined in a model, such as in a linear model, to predict or determine system random read performance (e.g., random read performance as seen by a host device). In some aspects of the present disclosure, the model can be used to predict or determine system random read performance of a computing system based on the capabilities of an adjustable component system component, such as a NAND die or NAND architecture.

Turning now to the figures, FIG. 1 illustrates a system 100, in accordance with examples of the present disclosure. The computing system 100 can include any computing resource that is configured with one or more hardware or software components to implement the techniques described herein. In an example, the computing system 100 is an endpoint device (e.g., a mobile computing device), a computing server, a storage system, or a network-based or hosted computing environment (e.g., a virtual machine, cloud storage system, cloud messaging platform, cloud-based email systems, or other cloud-based computing environment). The computing system 100 can also include any computing system that is configured with devices that generate, store, access, or otherwise operate on, or communicate, digital data. The computing system 100 can be a standalone computing system, such as a server, or a distributed computing system. In an example, the computing system 100 includes a host device 105, a storage device 130, and a prediction system 190. In an example, one or more components of the computing system 100 is a logical or analytical model that is configured to model, or be used to simulate, the operation of a physical component of the system.

The host device 105 can include any computing resource that is associated with the computing system 100 and configured to interface with the storage device 130 to process data access operations, such as random read operations. The host device 105 can include a host processor, a central processing unit, or one or more other computing device, processor, controller, or control circuitry. The host device 105 can also include a host interface (I/F) 120, such as a bidirectional parallel or serial communication interface, to communicate with the storage device 130. Examples of the device interface 120 can include, but are not limited to, a serial advanced technology attachment (SATA) interface, a peripheral component interconnect express (PCIe) interface, universal serial bus (USB) interface, Fibre Channel, Serial Attached SCSI (SAS), an eMMC™ interface, etc. In an example the host device 105 includes an application 110, an operating system 115, and the front-end interface 120. The application 110 includes any software application that is configured with instructions that are executable by the host device 105 to issue data access requests to the operating system 115 to write data to, or to retrieve data from, the storage device 130. The data access request can be transmitted through one or more layers or abstraction, such as though software drivers or software wrappers or applications, before they are received at the operating system 115. The operating system 115 is configured to transmit the data access requests to the storage device 130 using the device interface 120. In an example, the operating system 115 can delay transmission of one or more data access request due front-end communication bus contention or a communication latency associated with the device interface 120 or the storage device 130. In an example, the operating system 115 stores the delayed data access requests in one or more host queues and dispatches requests from such queues to the storage device 130 when access to the storage device becomes available.

In an example, the host device 105 is configured to use logical block addressing techniques to access data blocks stored by the storage device 130. Accordingly, a data access request transmitted from the host device 105 by the operating system 115 over the device interface 120 can include a logical address for a data block to write to, or to read from, the storage device 130.

The storage device 130 can include any array-based storage device that is configured with one or more circuits or software applications to process data access request received from the host device 105. The storage device 130 can be configured as, or can include, a universal flash storage (UFS) device, an embedded MMC (eMMC™) device, or one or more other memory devices. For example, if the storage device 130 includes a UFS device, the communication interface used to couple the host device 105 to the storage device can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage device 130 includes an eMMC device, the communication interface (e.g., the device interface 120 or a front-end communication bus) used to couple the host device 105 to the storage device can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage device 130 can include one or more other memory devices, or the communication interface used to couple the host device 105 to the storage device.

In an example, the storage device 130 includes a storage controller 135 and one or more data storage array 180 and 185. The storage controller 135 can include a processor 140, or other control circuitry, that is configured to execute instructions (which may be software or hardware; in this example, described as firmware 145) to process data access requests received from the host device 105. In an example, the storage controller 135 is a microcontroller, special purpose logic circuitry (e.g., a field programmable gate array (FPGA), an application specific integrated circuit (ASIC), etc.), or another suitable processor. The storage controller 135 can also include the firmware 145, a device interface 150, a device queue 155, a memory 160, an array interface 175, and other hardware circuits, such as one or more integrated circuits and/or discrete components. The firmware 145 can include computer code or instructions that are executable by the storage controller 135 or the processor 140 to perform operations to transfer data to, or to receive data from, the storage array 180 or 185. In an example, the firmware 145 is encoded in one or more hardware circuits that are associated with the storage controller 135. The firmware 145 can include, amongst other things, firmware routines for translating logical block addresses to physical block addresses. The host interface 150 includes any data communication interface that is configured to interface with the host device 105 through the storage interface 120. The device queue 155 includes one or more hardware or software queue that is configured to temporarily store translated storage array commands (e.g., commands to read data from, or to write to, physical addresses in the storage array 180 or 185) for dispatch to the storage array 180 or 185 through the array interface 175. In an example, the device queue 155 includes a part of the memory 160.

The memory 160 can include an array of memory cells to which data can be written at a lower cost than writing data to the storage array 180 or 185. In an example, the memory 160 includes arrays of static memory, such as an array of static random-access memory 165 (SRAM). At least part of the SRAM can be used as a cache for storing logical address to physical address (L2P) translations. In another example, the memory 160 includes arrays of dynamic random-access memory 165 (DRAM) or persistent memory, such as randomly addressable memory that is preserved through a power cycle. The memory 160 typically includes volatile memory, but some non-volatile memory technologies can be used in the write cache provided that such technologies enable data to be written at a lower cost (e.g., faster) than the cost for writing data to the storage array 180 or 185.

The storage array 180 or 185 can be configured to provide non-volatile storage for data received from the host device 105. Such non-volatile storage can be provided by one or more types of non-volatile memory devices, such as NAND flash memory devices or NOR flash memory devices. Such non-volatile memory devices can include one or more arrays of memory cells such as single-level cells (SLCs) or multi-level cells (MLCs) (e.g., triple-level cells (TLCs) or quad-level cells (QLCs)). In some conventional industry usage, the term MLC has been used to identify memory cells that can store two bits of data per cell (e.g., one of four programmed states); but is also utilized in a broader context to refer to memory cells that can store more than one bit of data per cell (i.e., that can represent more than two programmed states). Unless clearly indicated otherwise by express language or context, MLC is used herein in the broader context and includes, for example, TLC and QLC memory cells. Each of the memory cells can be configured to store bits of data (e.g., data blocks) received from the host device 105. In an example, the storage array 180 or 185 can include random access memory (RAM), such as battery-backed RAM. In other examples, the storage array 180 or 185 can include read-only memory (ROM), phase change memory (PCM), magneto random access memory (MRAM), and electrically erasable programmable read-only memory (EEPROM).

In an example, the storage array 180 or 185 can include one or more non-volatile memory devices (e.g., one or more NAND die) that is configured with one or more parallelism feature, such as support for multiplane reads (MPR) or independent wordline reads (iWL). A non-volatile memory device that is configured to support MPR can concurrently process two or more independent commands to read two or more different planes of an MLC storage array in parallel, provided that the commands are issued at the same time, complete at the same time, and are of the same type (e.g., each command is a command to read SLC or MLC memory). Non-volatile memory device that is configured to support iWL can concurrently process two or more independent commands to read two or more planes of an MLC array in parallel without the MPR restrictions.

The prediction system 190 includes one or more hardware circuits or software applications that is configured to provide performance prediction capabilities, such as for predicting the random read performance of the computing system 100. In an example, predicting the random read performance of the computing system 100 includes predicting, or determining, the rate at which random reads can be issued by the host device 105 and serviced by the storage device 130. Stated another way, determining the random read performance of the computing system 100 include predicting, or determining, random read IOPS as seen from the host device 105. In an example, the prediction system 190 is a part of the computing system 100. In another example, the prediction system 190 is a standalone component or system. The prediction system 190 can be coupled to, or can have components that interface with, the host device 105, the storage device 140, or one or more subcomponents thereof, to monitor and capture performance data, as described herein. The prediction system 190 can include one or more logical or analytical models of one or more components of the computing system 100 and may interface these models with hardware, software, or simulated components of the computing system 100 to obtain simulated performance data. In an example the performance data includes data that is indicative of the impact of a component of the computing system 100 on the random read performance of the system. In an example the performance data includes data that is indicative of the configuration or one or more data processing characteristics of a component of the computing system. In an example the prediction system 190 uses the performance data to generate and operate a random read performance model for determining the random read performance of the computing system 100.

In an example, the prediction system 190 predicts the random read performance of the computing system 100 based on performance data obtained from one or more components of the computing system 100 and the predicted, modeled, or simulated, performance of a non-volatile storage device, such as the storage array 180 or 185. The prediction system 190 can predict random read performance of the computing system 100 based on any metric or performance measurement that is useful for identifying components of the computing system 100 that impact or affect random read performance at the host device 105. The prediction system 190 can also predict random read performance of the computing system 100 based on any metric or performance measurement that is useful for characterizing the impact of these components on the random read performance seen at the host device 105. In an example, the prediction system 190 predicts random read performance of the computing system 100 based on the read queue depth of the host device 105, front-end or back-end communication bus contention and latency, parallelism features of the storage array 180 or 185, storage device L2P translation cache hit rate, storage device firmware overhead, and/or host overhead.

An overly optimistic estimate or prediction of random the read performance of the computing system 100 can be obtained from equation (1), where random read performance $RR_{performance}$ is predicted based on the number of storage arrays 180 or 185 that can be accessed in parallel ($D_{count}$), the time it takes to read a data block from one of the storage arrays ($t_{R\_snap}$), and the time is takes to transfer the data block to the host 105 ($t_{Xfer}$). Equation (1) assumes 100% utilization of each storage array, such as by ensuring that a random read command is always available to be issued to each storage array. Since such conditions are not always present, real world performance may often not achieve the so-determined random read performance.

$$RR_{performance} = \frac{D_{count}}{t_{R_{snap}} + t_{xfer}} \quad (1)$$

I. Host Queue Depth

Host queue depth (QD) corresponds to the number of outstanding commands that are maintained by the host device 105 during operation of the computing system 100, such as while executing the application 110 or tasks associated with the operating system 115. In an example, a host queue depth of 8 (QD8) indicates that the host device 105 initially issues 8 read commands, and as a first command completes, it is replaced by another commend, such as to ensure that the host queue remains loaded with 8 outstanding commands. Host queue depth can be obtained from the hardware or software specification of the host device 105 or from other documentation associated with the system 100. Host queue depth can be limited to a specified maximum queue depth based on the architecture of the storage device 130 or based on the communication or interfacing protocol used to interface the host device 105 with the storage device 130. In an example, systems that implement UFS and eMMC interfaces are limited to a maximum QD of 32 (e.g., QD32). The limits placed on the host queue depth limit the number of commands that are available to be issued to a storage die, and thereby constrain storage array utilization (e.g., die utilization). The prediction system 190 can determine expected storage array utilization for the computing system 100 for a given host queue depth through simulation, and can incorporate such utilization in the prediction model used to predict random read performance of the computing system 100.

Figures 2A, 2B, 2C:
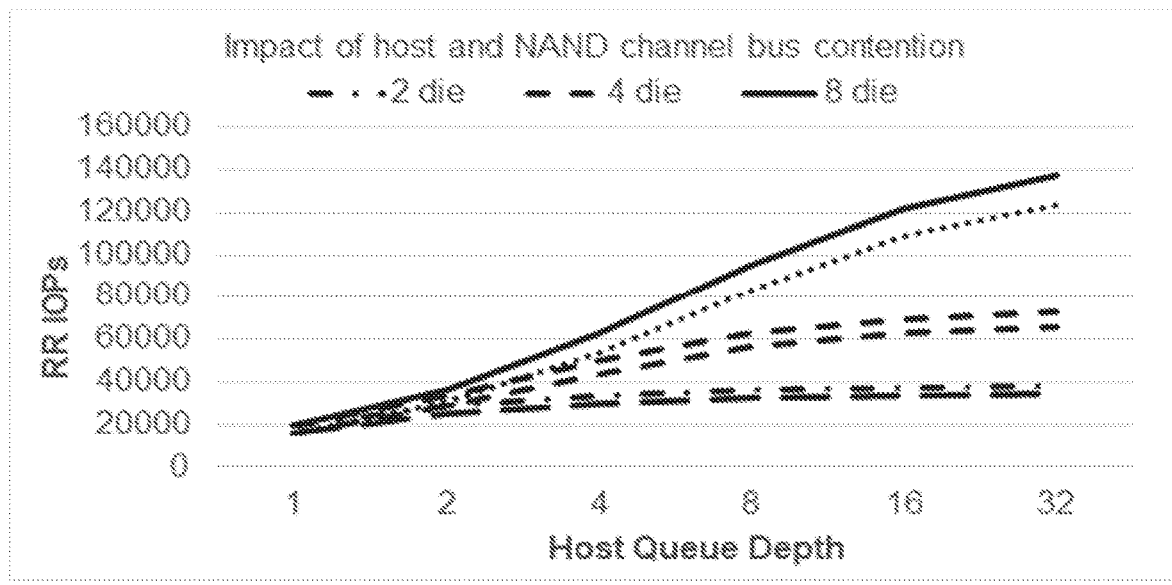
FIG. 2A depicts the expected die utilization for configurations of computing system for different host queue depth, in accordance with examples of the present disclosure.
FIG. 2B depict curves that are useful for comparing predicted random read performance of a system based on a simulations that ignore interface bus contention and simulations that account for interface bus contention, in accordance with examples of the present disclosure.
FIG. 2C depicts random read performance improvement due to MPR at different queue depths and topologies, in accordance with examples of the present disclosure.

FIG. 2A shows the expected die utilization for configurations of the computing system 100 where the host device 105 is configured with QD1-QD32 and the storage device 130 is configured with 2, 4, or 8 storage arrays. As shown in FIG. 2A, storage array utilization can vary with storage array count and host queue depth. The lowest utilization is observed at the high storage array count and low host queue depth corner of the table, while the highest utilization is observed at the low storage array count and high queue depth corner.

Host queue depth is a resource constraint that can limit the random read performance of the computing system 100, such as by limiting storage array utilization. The prediction system 190 can use host queue depth, or simulated storage array utilization, to improve the prediction of the random read performance of the computing system 100 by incorporating these parameters into the prediction model. In an example, the prediction model is a linear model, and the prediction system 190 derives coefficients for one or more terms of the linear model based on host queue depth and corresponding storage array utilization simulation data, such as the simulation data provided in FIG. 2A. In another example, the prediction model includes a simulation component that is configured to simulate effect of host queue depth on storage array utilization, random read performance, or the performance of one or more components of the computing system 100.

II. Bus Contention and Latency

The computing system 100 includes a front-end communication bus to couple the device interface 120 to the host interface 150. The computing system 100 further includes a storage array interface bus (e.g., a back-end communication bus) to couple the storage controller 130 to the storage array 180 or 185. Each communication bus has an associated data rate that determines its communication latency, such as the time it takes to serially transmit or receive a command and associated data over a communication channel formed by the bus. Communication latency can cause bus contention, such as when two or more components of the computing system 100 contend for access to a communication bus. Bus contention can limit the random read performance of the computing system 100. FIG. 2B depict curves that are useful for comparing predicted random read performance of a system based on simulations that ignore bus contention and simulations that account for bus contention. In a representative example, simulations assume an 800 mega-transfer per second channel and UFS G3×2L host interface. For each pair of lines, the upper line ignores bus contention and the lower considers contention. As shown in FIG. 2B, simulations that ignore bus contention tend to overestimate random read performance, with the amount of overestimation increasing with the random read performance of the computing system.

Interface bus contention is a limiting characteristic of the computing system 100 that can limit, or reduce, the random read performance of the system. In an example, the prediction system 190 incorporates simulated, modeled, or experimentally derived bus contention into the prediction model to improve the prediction of the random read performance of the computing system 100. In an example, the prediction model is a linear model, and the prediction system 190 derives coefficients for one or more terms of the linear model based on interface bus contention, communication latency, or other associated parameters (e.g., communication bus transfer bandwidth) of the front-end or back-end communication bus. In another example, the prediction system 190, or the prediction model, includes a simulation component that is configured to simulate effect of bus contention on random read performance or on one or more other characteristics or components of the computing system 100.

III. Parallelism Features of a Storage Array

The storage array 180 or 185 can be configured with parallelism features, such as MPR and iWL, to increase the number of concurrently active read commands in a storage array above one. In the case of MPR, three characteristics of this parallelism feature can be considered for their impact on random read performance.

The requirement that commands issue at the same time is satisfied by hardware or firmware through the use of back-end queues, such as the device queue 155, that store L2P translated read commands according to the target storage array plane from which data will be read. Commands that target different planes of the same storage array can be combined into a single MPR command and issued to the storage array. The likelihood of finding a matching pair of commands (e.g., commands to do not target the same plane) depends on the number of storage arrays in a given storage device and the number of commands in the backend queue. The number of commands in the backend queue depends on host queue depth. FIG. 2C shows simulation data that indicates that MPR provides a random read performance improvement that, in view of the requirement that commands issue at the same time, is greatest when the ratio of commands per storage array is largest (e.g., in a computing that has with low storage array count and large host queue depth). In an example, the prediction system 190 incorporates the effect of the increased number of active commands per die into the prediction model through the use of one or more simulation, model, or experimentally derived model terms or parameters using any suitable technique.

The requirement that commands complete at the same time introduces a read penalty in the form of increased latency in the time it takes to read a data block from a storage array ($t_{R\_snap}$). This increased latency can be determined through simulation, such as by simulating the operation of a storage device that implements MPR and a storage device that does not implement MPR, determining the difference in $t_{R\_snap}$, between the simulations. In an example, the data depicted in FIG. 2C can be used determine the average effect of this penalty by per MPR command by dividing the simulated experimentally derived latency penalty by the number of MPR operations.

The requirement that commands must be of the same type (e.g., SLC/MLC) can improve random read performance in storage devices that support MPR. The performance improvement is at least partially realized by reducing the amount the amount of L2P translations that need to be cached by the storage controller 135, thereby increasing L2P cache hit rate for random reads. In an example, the prediction system 190 incorporates the effect of this requirement on L2P cache hit rate into the prediction model through the use of one or more simulation, model, or experimentally derived model terms or parameters, as described herein.

The prediction 190 can incorporate the benefits or penalties associated iWL parallelism features into the prediction model for predicting random read performance by using one or more of the previously discussed techniques.

IV. Storage Device L2P Cache Hit Rate

L2P translations are generally stored in an L2P translation table. The size of the L2P translation table depends on the range of address that are accessible by, or the address space of, the host device 105 or the storage device 130. This in turn depends on the size and topology of the storage array 180 or 185. In an ideal configuration, the entire L2P translation table is stored in internal SRAM of a storage controller, such as the storage controller 135. This reduces latency by ensuring that address translations can be quickly obtained without having to access secondary memory. However, real storage devices, such as the storage device 130, are configured with storage controllers that are resource limited and therefore generally do not have enough SRAM to store an entire L2P translation table. In such devices, a part of the L2P translation table is stored in an SRAM L2P cache in the storage controller, while other parts of the translation table are stored in slower secondary memory, such as DRAM or reserved parts of the storage array (e.g., on the NAND die). L2P cache hit rate corresponds to the rate at which logical to physical address translations for translating logical addresses in random read requests are found in the L2P cache of a storage controller. Random read request that include logical addresses that do not have translations in the L2P cache incur a latency penalty that corresponds to the time needed to retrieve the address translation from secondary memory. In an example, the latency penalty is the time needed to read a block of data from the storage array 180 or 185.

Figure 3A:
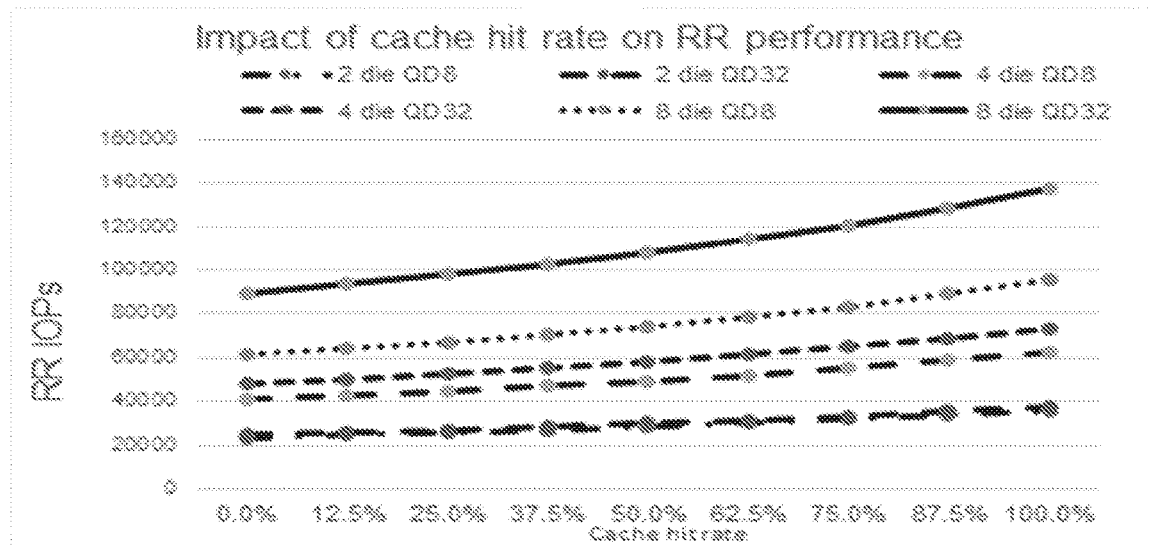
FIG. 3A depicts the impact of logical address to physical address cache hit rate, in accordance with examples of the present disclosure.

Conventional techniques for estimating random read performance, such as through the use of equation (1), do not adequately account for the effect of L2P cache hit rate. The latency penalty incurred by a L2P cache miss can significantly reduce the random read performance. FIG. 3A illustrates the impact of L2P cache hit rate, or the impact of the latency penalty due to L2P cache misses, on simulated system random read performance for various storage device architectures. In an example, the prediction system 190 incorporates the simulated, modeled, or experimentally derived effect of L2P cache hit rate into the prediction model to improve the prediction of the random read performance of the computing system 100. In an example, the prediction system 190 derives coefficients for one or more terms of a linear prediction model based on simulated or experimentally derived L2P cache hit rate data, such as shown in FIG. 3A. In another example, the prediction system 190 includes a simulation component that is configured to simulate effect of L2P cache hit rate on random read performance or one or more characteristics or components of the computing system 100. The simulation component can be incorporated in, for example, a logical prediction model using any suitable model construction technique.

V. Storage Device Firmware Overhead

Figure 3B:
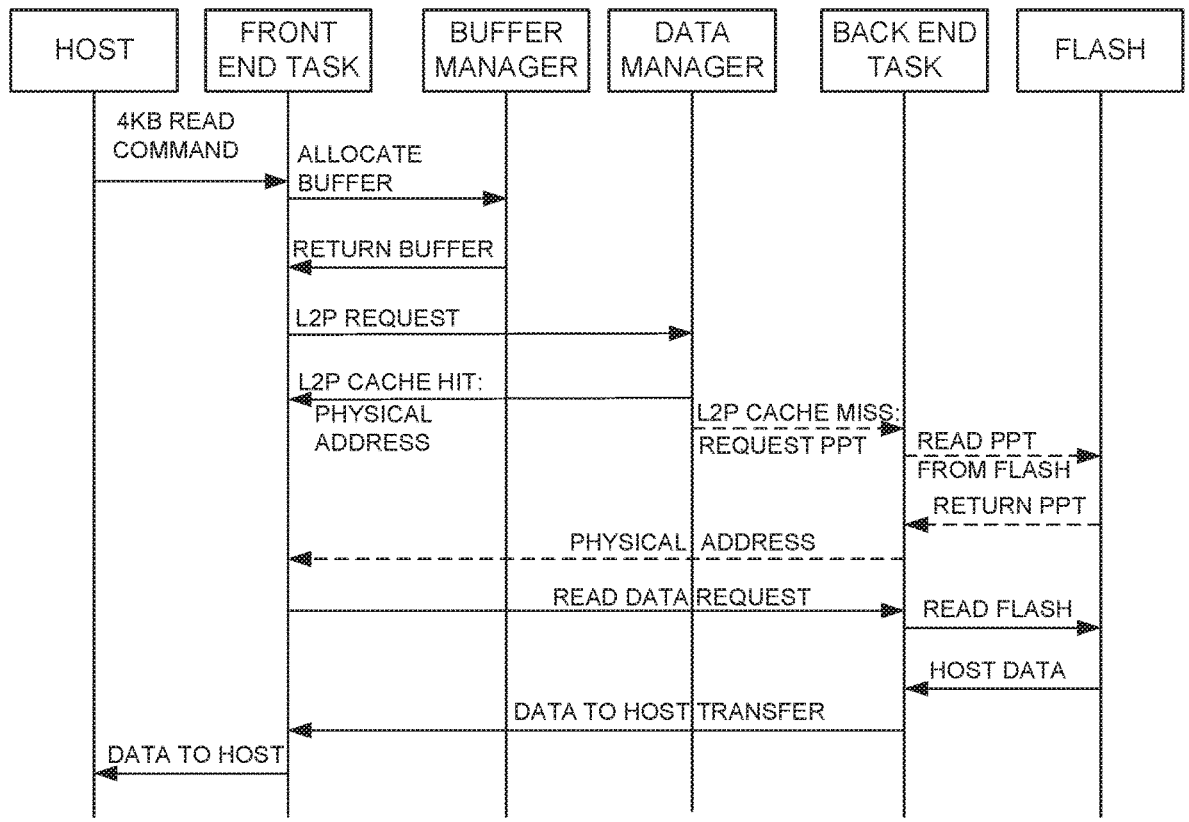
FIG. 3B depicts random read single command execution in a computing system, in accordance with examples of the present disclosure.

Random read commands received by the storage device 130 are processed by firmware 145. FIG. 3B shows a flowchart of a random read execution process. As shown in FIG. 3B, that executing a random read command includes allocating memory for temporarily storing the requested data, performing address translations, issuing read request to the storage array die, retrieving the requested data form the storage array die, and transferring the retrieved data to the host device. Storage device firmware overhead (hereinafter, "firmware overhead") can reduce or limit random read performance, such as by increasing the latency associated with the execution of random read commands. Such firmware overhead, however, can vary based on the architecture of a storage device. In an example, firmware overhead is affected by the size of storage controller L2P cache or by L2P cache hit rate. In an example, measured or simulated firmware overhead of a computing system per random read command in the case of an L2P cache hit during address translation is 13.2 seconds, while the firmware overhead in the case of a cache miss is 20.4 seconds. In an example, the firmware overhead determines a random read performance ceiling for a computing system. Continuing the previous example, such the performance ceiling include a (1/13.2 us)=75.7 K IOPs for cache hit performance limit or a (1/20.4 us)=49.0 K IOPs for cache miss performance limit. Firmware overhead is also affected by the use of hardware acceleration in a storage controller. Such hardware acceleration can reduce latency by parallelizing the execution of one or more of the operations illustrated in FIG. 3B.

In an example, the prediction system 190 incorporates the simulated, modeled, or experimentally derived effect of firmware overheard into the prediction model to improve the prediction of the random read performance of the computing system 100. In an example, the prediction system 190 derives coefficients or limiting the value of one or more terms of a linear performance model based on the performance ceiling or latency penalties prescribed by the firmware overhead. In another example, the prediction system 190 includes a simulation component that is configured to simulate the effect of firmware overhead (e.g., the performance ceilings prescribed by the firmware overhead) on random read performance or one or on more other characteristics or components of the computing system 100. The simulation component can be incorporated in, for example, a logical prediction model using any suitable model construction technique.

VI. Host Overhead.

Figures 4A, 4B:
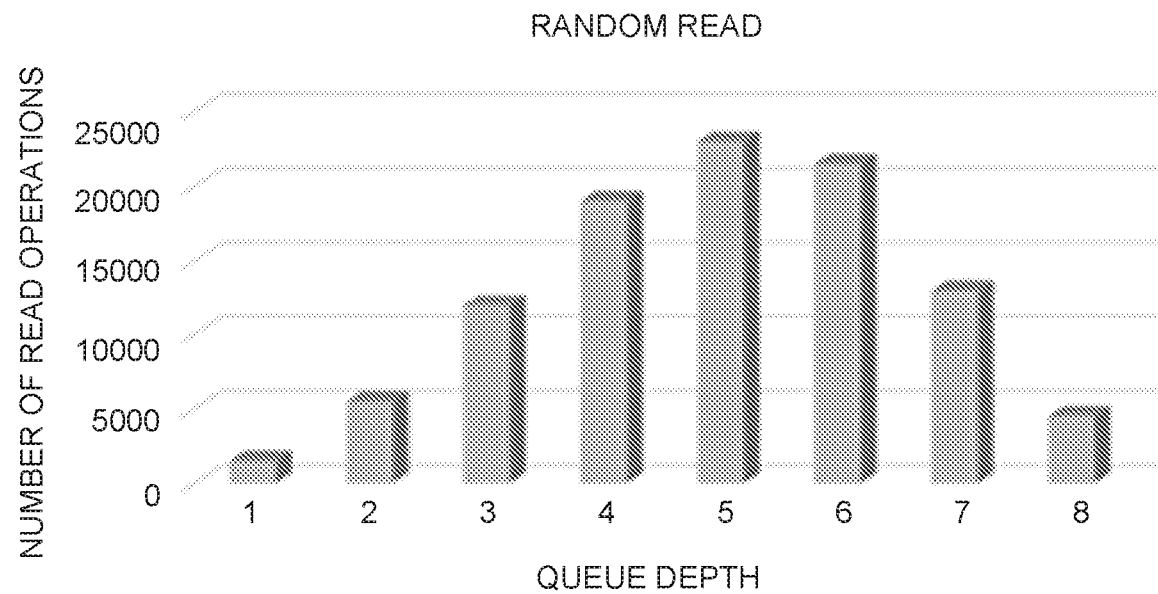
FIG. 4A depicts the results from a system overheard benchmark of random read performance and effective queue depth, in accordance with examples of the present disclosure.
FIG. 4B depicts effective queue depth statistics obtained from a benchmark of random read performance and effective queue depth, in accordance with examples of the present disclosure.

Host overhead includes overheard attributable to one or more host components of the system 100, such as an operating system and associated inefficiencies, the number of threads in which processes can concurrently execute, or storage block sizes and other mounting options. Host overheard is system dependent and can impact random read performance through its effect on the performance or utilization of one or more of the system of storage device components described herein. In an example, host overhead can reduce prescribed host queue depth to a smaller effective or realized queue depth, such as due to inefficiencies in the host device that limit the full utilization of host queues. FIG. 4A illustrates the results of a system overheard benchmark of random read performance and effective queue depth for a simulated system having QD8, a 4 KB block size, and executing 8 threads concurrently. FIG. 4B depict effective queue depth statistics obtained from the benchmark. As shown in FIG. 4B, a host queue depth of 8 can result in an average device level queue depth (e.g., an effective queue depth) of as low as 5, significantly degrading performance below the storage device capability.

In an example, the prediction system 190 incorporates the simulated, modeled, or experimentally derived effect of host overheard into the prediction model to improve the prediction of the random read performance of the computing system 100. In an example, the prediction system 190 derives coefficients for one or more terms of a linear performance model based on the difference between host queue depth and effective queue depth prescribed by the host overhead. In another example, the prediction system 190 includes a simulation component that is configured to determine the effect of host overhead (e.g., the difference between host queue depth and effective queue depth) on random read performance or on one or more other characteristics or components of the computing system 100. The simulation component can be incorporated in, for example, a logical prediction model using any suitable model construction technique.

Figure 5:
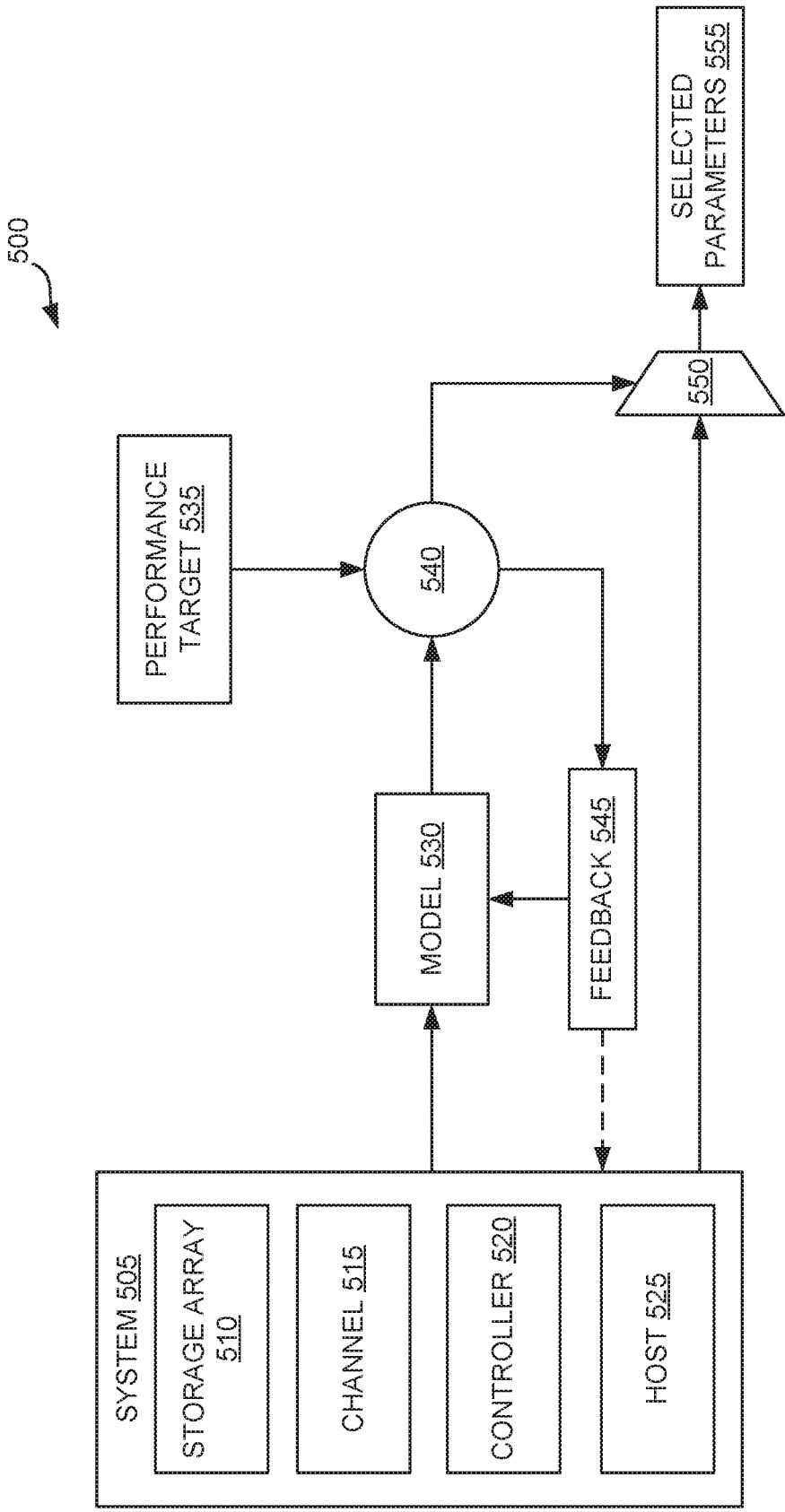
FIG. 5 illustrates a block diagram of prediction system, in accordance with examples of the present disclosure.

FIG. 5 illustrates a block diagram of a prediction system 500, in accordance with examples of the present disclosure. The prediction system 500 can be an example of the prediction system 190, as shown in FIG. 1. In an example, the prediction system 500 can be used to determine a value for one or more adjustable parameters, or adjustable capability, of a component of the computing system 100, such as to cause the system to achieve a target random read performance 535. In an example, the prediction system 500 includes a system component 505, a prediction model 530, an evaluation component 540, a feedback component 545, and a selection component 550.

In an example, the system component 505 includes system components that are represented as model, simulation, experimentation data, or any other information that is suitable for characterizing the performance or impact of a one or more components of the computing system 100 on random read performance. In an example, the system component 505 includes an analytical model, or a simulation model, that is configured to received parameters that are indicative of a configuration of a component of the computing system 100 and to provide output data that is indicative the impact of the component on random read performance. In another example, the system component 505 includes a database of simulated or experimentally obtained data that is indicative the impact of the component on random read performance. Such database can be queried or indexed using parameters or arguments that are indicative of a configuration of the component. In an example, the parameters can be provided by the prediction system 500, a user, or feedback component 545, or the computing system 100.

In an example, the system component 505 includes a storage array component 510, a channel component 515, a controller component 520, and a host component 525. The storage array component 510 is configured to model, simulate, or characterize storage array characteristics that affect random read performance. Such storage array characteristics can include storage array read time (e.g., $t_{R\_snap}$), data transfer rate (e.g., $t_{Xfer}$), architecture (e.g., SLC or MLC), or parallelism features (e.g., support for MPR or iWL). The channel component 515 is configured to model, simulate, or characterize the effect of a front-end or back-end communication bus on random read performance. In an example, the channel component 515 considers parameters such as communication bus data transfer rate, number of communication channels, and latency (e.g., latency due to bust contention). The controller component 520 is configured to model, simulate, or characterize controller characteristics that affect random read performance. Such controller characteristics can include the size of L2P cache, L2P cache hit rate, or firmware overheard, as described herein. The host component 525 is configured to model, simulate, or characterize host capabilities or characteristics that affect random read performance. Such host capabilities or characteristics can include the host operating system and associated inefficiencies, number of threads in which processes can concurrently execute, block size and other mounting options, as described herein.

In an example, the prediction model 530 includes a model that is useful for predicting random read performance of the computing system 100. In an example the prediction model 530 is an analytical model that is constructed from output received from the system component 505. In an example, the analytical model is linear model that combines one or more outputs of the system component 505 using regression techniques. In an example, the prediction model 530 is a logical model that incorporates one or more limitations or relationships that is derived from the output of system component 505. In an example the predication model 530 includes equation (1) or a mathematical or logical variation of equation (1). The prediction model 530 can be executed or simulated to predict random read performance of the computing system 100.

The evaluation component 540 can include one or more circuits of software application that is configured to compare the random read prediction provided by prediction model 530 to a random read performance target 535. Errors, or differences, between the random read prediction provided by prediction model 530 to the random read performance target 535 can be provided to feedback component 550, such as to cause the feedback component to adjust the system component 505, or the prediction model, to reduce the error. In an example adjusting the system component 505 includes adjusting, or changing, one or more of the parameters used to determine configurations of the constituent components of the system component 505. In an example, storage array size or parallelism features can be adjusted, such as by selecting from one or more available features, to change the prediction model 530 or data provided to characterize the operation of the storage array. In an example, adjusting the prediction model 530 includes adjusting one or more terms, weights, or coefficients of the model, such as to enhance, reduce, eliminate, or include the impact of one or more constituent component of the system component 505 on random read performance. In an example, one or more parameters that are available for adjusting can be provided to the system component 505, the prediction model 530, or the feedback component 545.

If the random read prediction provided by prediction model 530 agrees with the random read performance target 535 within a specified threshold value, an output of the evaluation component 540 is provided to selection component 550 to provide the currently selected system component 505 parameters as selected parameters 555. In an example, the selected parameters 555 are used to identify the configurations, or characteristics, or one or more components of the system that are used to achieve the random read performance target.

The selected parameters 555 can be analyzed to determine an improvement to the system 100 to achieve the random read performance target 535. In an example, the selected parameters 555 indicates that the random read performance target 535 can be achieved by improving an initial configuration (e.g., a base or default configuration) of the system 100 by implementing the storage array component 510 using a NAND device that includes one or more parallelism feature, such as MPR or iWL. Further analysis of the selected parameters 555 can indicate that random read performance of the system 100 is particularly sensitive to, or dependent on, random read latency, such as latency induced by delaying read instruction dispatch to storage array component 510 (e.g., delaying read instructions to satisfy MPR requirements). In view of this additional insight, the system 100 is improved to achieve the random read performance target by implementing the storage array component 510 using a NAND device that supports iWL rather than MPR.

The selected parameters 555 can be analyzed to determine that a particular component of the system components 505 is a performance bottleneck, and that an improvement to this component should be included in any improvement to the computing system 100 to achieve the random read performance target improvement. In an example, a planned improvement to the computing system 100 includes an upgraded implementation of the storage array component 510 to a NAND device that includes one or more parallelism feature. The selected performance parameters 555, however, generated from a simulated configuration of the system that includes the upgraded storage array component 510 indicates that latency attributable to L2P paging operations of the controller component 520 is a random read performance bottleneck that limits the achievable performance of the improved computing system 100. The selected performance parameters 555, for examples, indicates that the random read performance target is only achieved by the improved computing system 100 by increasing the L2P cache size of the storage controller component 510 to an indicated cache size. Based on this insight, the computing system 100 is implemented to include the upgraded implementation of the storage array component 510 and an upgraded storage controller that includes an L2P cache that is at least as large as the indicated cache size.

Figure 6:
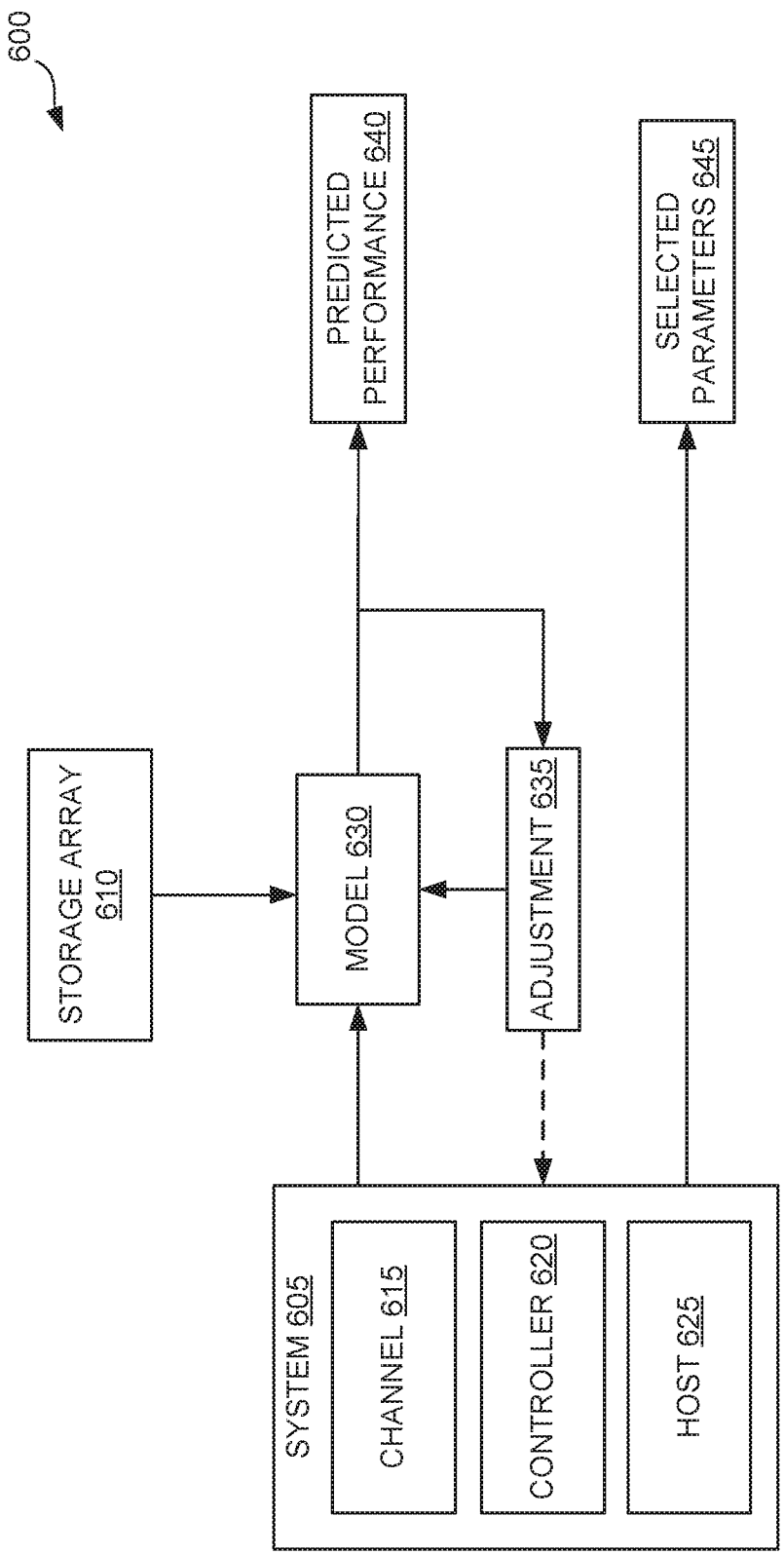
FIG. 6 illustrates a block diagram of prediction system, in accordance with examples of the present disclosure.

FIG. 6 illustrates a block diagram of prediction system 600, in accordance with examples of the present disclosure. The prediction system 600 can be an example of the prediction system 190, as shown in FIG. 1. The prediction system 600 be also be an example of the prediction system 500 but modified as described herein. In an example, the prediction system 600 used to determine or characterize the random read performance of the computing system 100. In another example, the prediction system 600 determines a configuration of one or more components of the computing system 100, configured with a specified storage array component, for achieving an indicated random read performance. The prediction system 600 includes a system component 605, storage array 610, prediction model 630, and feedback component 635. The system component 605 is an example of the system component 505. In an example, the system component 605 includes a channel component 615, a controller component 620, and a host component 625, all of which are analogous the corresponding constituent components of the system component 500. In an example, the storage array 610 is a model of a storage array whose performance is to be evaluated using the prediction system 600.

The prediction model 630 includes a model that is useful for predicting random read performance of the computing system 100. In an example the prediction model 630 is an analytical model that is constructed from the storage array 610 and output received from the system component 605. In an example, the analytical model is linear model that combines a model of the storage array 610 with one or more outputs of the system component 605 using regression techniques. In an example, the prediction model 630 is a logical model that incorporates one or more limitations or relationships that is derived from the model of the storage array and the output of system component 605.

In operation, the prediction model 630 predicts random read performance 640 of the computing system 100 based on the system component 605 and storage array 610. In an example, feedback component 635 is configured to adjust the system component 605, or the prediction model, such as to iteratively generate range of possible random read performances that are indicative of the range of random read performances attainable by the computing system 100 based on a specified storage array capability and one or more adjustable system components. In another example, the feedback component 635 iteratively adjust the parameters of one or more constituent components of the system component 605 to determine, based on the result of predicted random read performance, a component that has a threshold limiting impact (e.g., the most limiting impact or a specified degree of impact) on the random read performance of the computing system 100. In an example, selected parameters of the system component 645 can be provided after each iteration of random read prediction.

The predicted random read performance 640 and the selected parameters 645 is analyzed to determine a configuration of a component of the system components 605 that has a threshold limiting impact (e.g., the most limiting impact or a specified degree of impact) on the random read performance of the computing system 100. This insight can be used to determine, or to select, configurations of one or more of the system component 605 to fabricate an implementation of the system 100 that optimizes random read performance for an indicated configuration of the storage array component 610. In an example, the predicted random read performance 640 and the selected parameters 645 indicates that, for an indicated configuration of the storage array 610, an indicated predicated random read performance (e.g., the large improvement in random read performance) is achieved by increasing storage array utilization, such as by increasing the host queue depth of the host 625 to an indicated host queue depth, such as indicated by the selected parameters 645. Based on this insight, the system 100 is implemented to include the indicated storage array 610 and a host component 625 is configured to a host queue that is at least a deep, or as large, as the indicated host queue depth. In an example, this includes configurating the host component 625 with a storage array driver or a storage interface component, such as the storage interface 120, that implements or supports the indicated host queue depth. In another examples, this includes configuring the system 100 with a front-end communication bus, including storage interface 120 and device interface 150 and associated communication protocol, to implement or support the indicated host queue depth.

Figure 7:
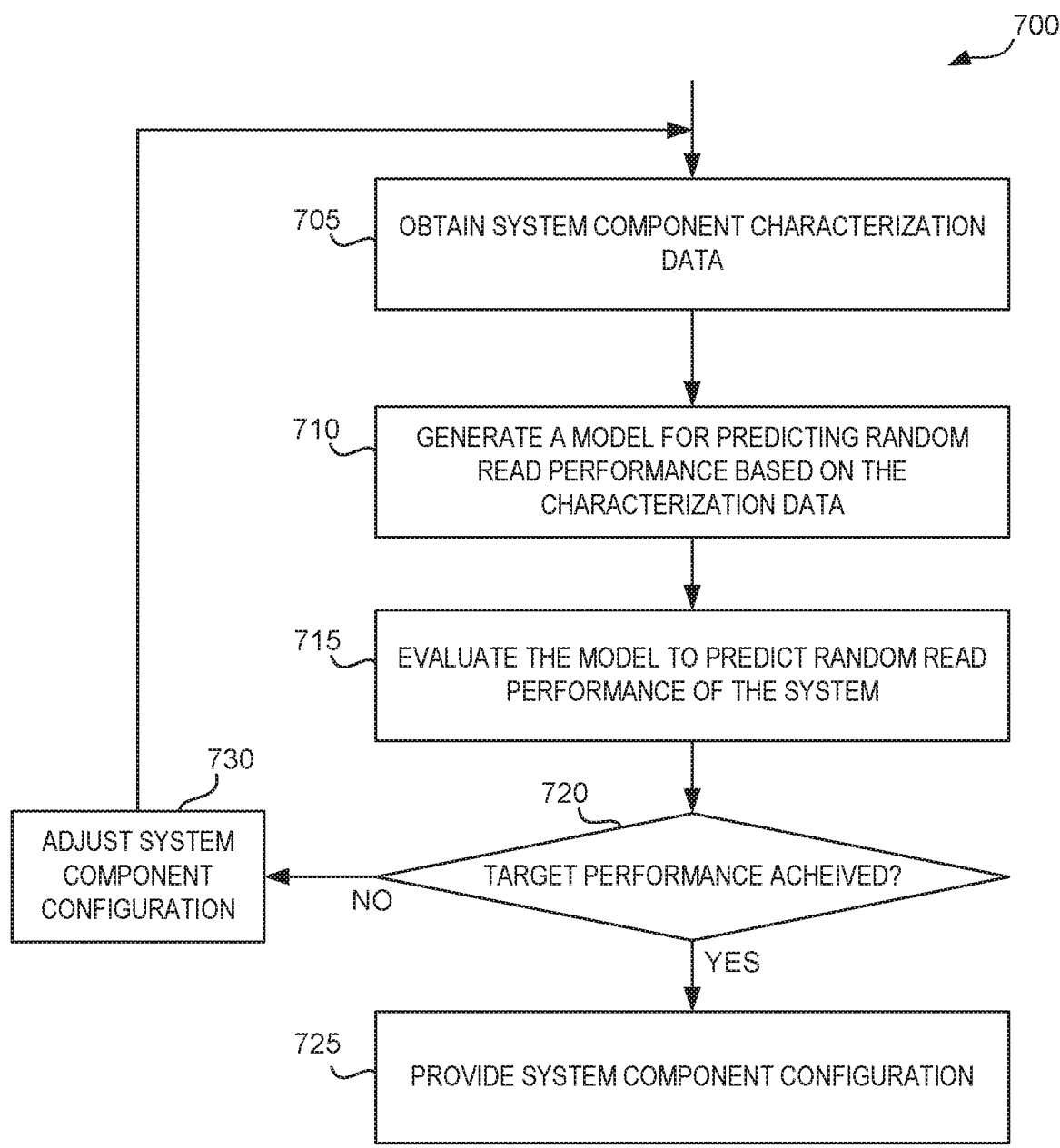
FIG. 7 depicts a process for determining parameters or characteristics for components of a system that includes an array-based storage device, in accordance with examples of the present disclosure.

FIG. 7 depicts a process 700 for determining parameters or characteristics of components of a computing system, such as the computing system 100, that includes an array-based storage device, in accordance with examples of the present disclosure. In an example, the process 700 includes steps for implementing the techniques of the prediction system 500. At 705, characterization data of one or more components of the computing system 100 is obtained. Such characterization data includes any data that is useful to characterizing the impact or limiting effect of the components of the computing system on random read performance, as described herein. In an example, the characterization data include models of the system components or simulated or experimentally derived data that is indicative of the impact or effect of the components of the computing system on random read performance, as described herein. The characterization data can be obtained experimentally (e.g., by instrumenting and operating software applications and hardware circuits) or by simulating the operation of the computing system based on indicated configurations of the one or more system components. The configuration of the one or more system components can be determined, or selected, using system parameters obtained from the prediction system, an operator, or one or more other source. In an example, such parameters are used to determine, or select, a configuration of components of the computing system 100, such as a configuration of the storage array component 510, the channel component 515, the controller component 520 or the host component 525. At 710, a prediction model, such as the prediction model 530, is generated based on the characterization data and the configuration of the one or more system components, as described herein. At 715, the prediction model is evaluated (e.g., simulated or executed) to predicted random read performance of the computing system 100 (e.g., to generate a random read performance figure). At 720, the predicted random read performance is compared to a target random read performance. The current configuration of the one or more system components is provided at 725 when the predicted random read performance agrees with the target random read performance with a specified threshold. The configuration of the at least one component of the one or more system components is adjusted at 730 when the predicted random read performance does not agree with the target random read performance with the specified threshold.

The process 700 can include any other steps or operations for implementing the techniques described herein. In an example, the system component configuration provided at 725 is analyzed to identify a configuration of one or more components of the computing system 100 to use to implement the computing system to achieve the random read performance target 535. In an example, the system component configuration includes information that is indicative of a host queue depth, front-end or back-end communication bus latency, a storage controller cache size, a storage array read time, or storage array parallelism feature that can be used to implement the system 100 to achieve a target random read performance. Insights derived from this information is used to selected at least one of a host queue depth, a front-end or back-end communication bus configuration (e.g., bus data width or data rate), a storage controller of storage controller cache size, or a storage array configuration (e.g., a size, read time, parallelism feature, or another other feature of a NAND device) of an implementation of the system 100. Insights derived from this information is used to selected configurations of any other component of the system 100, such as to achieve a target random read performance.

While the operations of the process 700 are shown as happening sequentially in a specific order, in other examples, one or more of the operations may be performed in parallel or in a different order. Additionally, one or more operations may be repeated two or more times.

Figure 8:
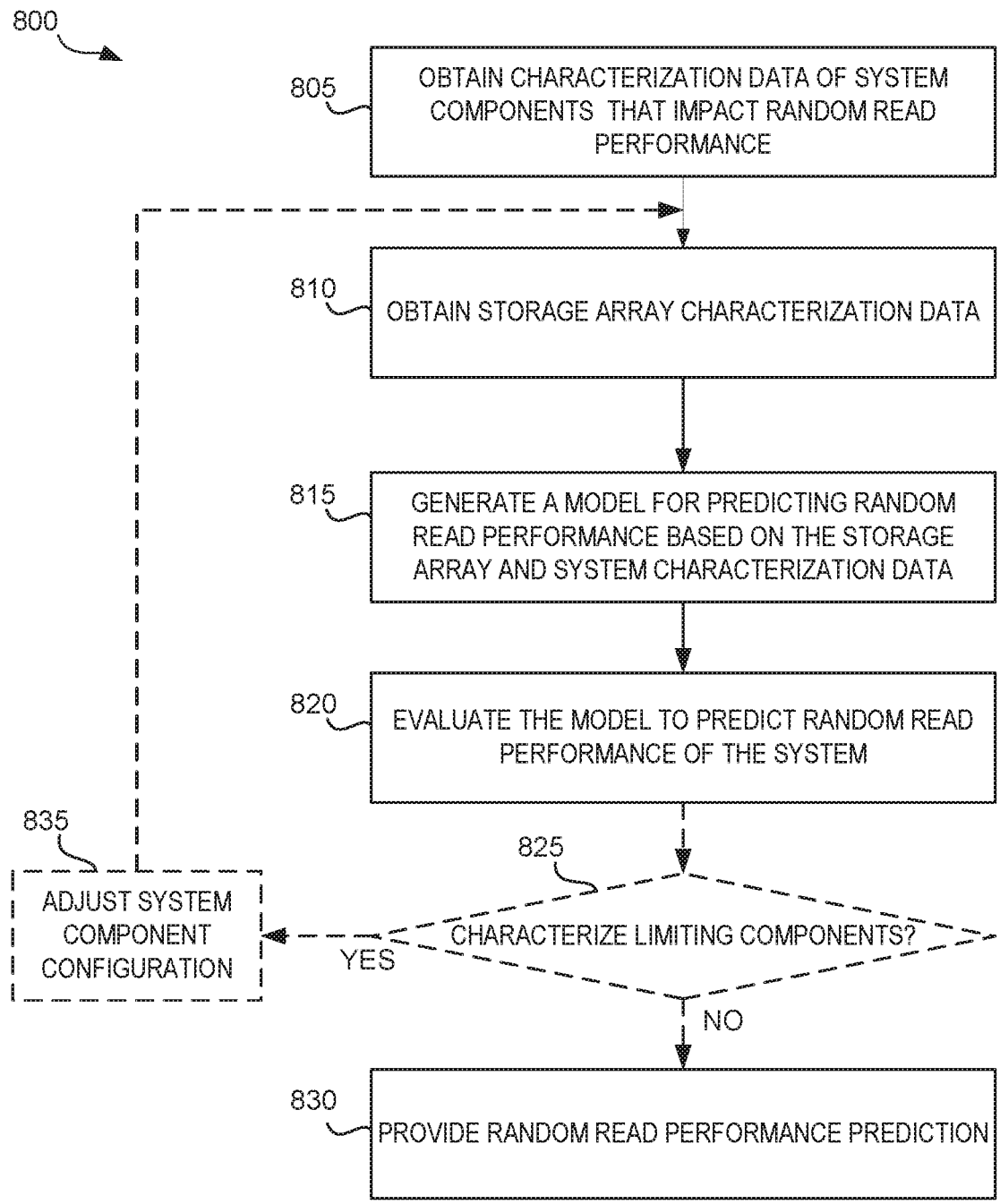
FIG. 8 depicts a process for predicting the performance of a system based on capabilities of an array storage device, in accordance with examples of the present disclosure.

FIG. 8 illustrates a process 800 for predicting the performance of a system, such as the computing system 100, based on capabilities of an array storage device, in accordance with examples of the present disclosure. In an example, the process 800 includes operations for implementing the techniques of the prediction system 600. In another example, the process 800 is used to identify, for a specified storage array configuration or architecture, one or more components of the computing system 100 that limit the random read performance of the computing system 100. In another example, the process 800 is used to determine the random read performance of the computing system 100 in view of a specified storage array configuration or architecture. At 805, characterization data of one or more components of the computing system 100 is obtained, as described herein. At 810, a storage array, or a model of storage array, is obtained. At 815, a prediction model, such as the prediction model 630, is generated by the prediction system based on the storage array and the characterization data, as described herein. At 820, the prediction model is evaluated (e.g., simulated or executed) to predict random read performance of the system. At 830 the predicted random read performance of the system is provided, such as to an operator or another computing system, for evaluation or other use.

In an example, the process 800 includes steps 825 and 835. In this example, steps 815, 820, 825, and 830 are repeatedly executed to adjust the configuration or characteristics of one or more system components, such as shown at step 835, generate a set of one or more random read performance predictions, and analyze the set of predictions, such as shown at 825, to identify a component of the computing system that has a threshold effect on the predicted random read performance. The identified component, or a configuration of the identified component, can be used to improve the random read performance of the computing system 100, such as by replacing the identified component with another component that has more capabilities.

The process 800 can include any other steps or operations for implementing the techniques described herein. In an example, at 830, a set of selected components parameters, such as the selected parameters 645, is provided along with the random read performance predictions. The set of selected components parameters and random read performance predictions are analyzed to identify, or to determine the configuration of, a component of the system 100 that has a threshold limiting impact (e.g., the most limiting impact or a specified degree of impact) on the random read performance of the computing system 100. An implementation of the system 100 can then be fabricated using the identified component, as described herein.

While the operations of the process 800 are shown as happening sequentially in a specific order, in other examples, one or more of the operations may be performed in parallel or in a different order. Additionally, one or more operations may be repeated two or more times.

Figure 9:
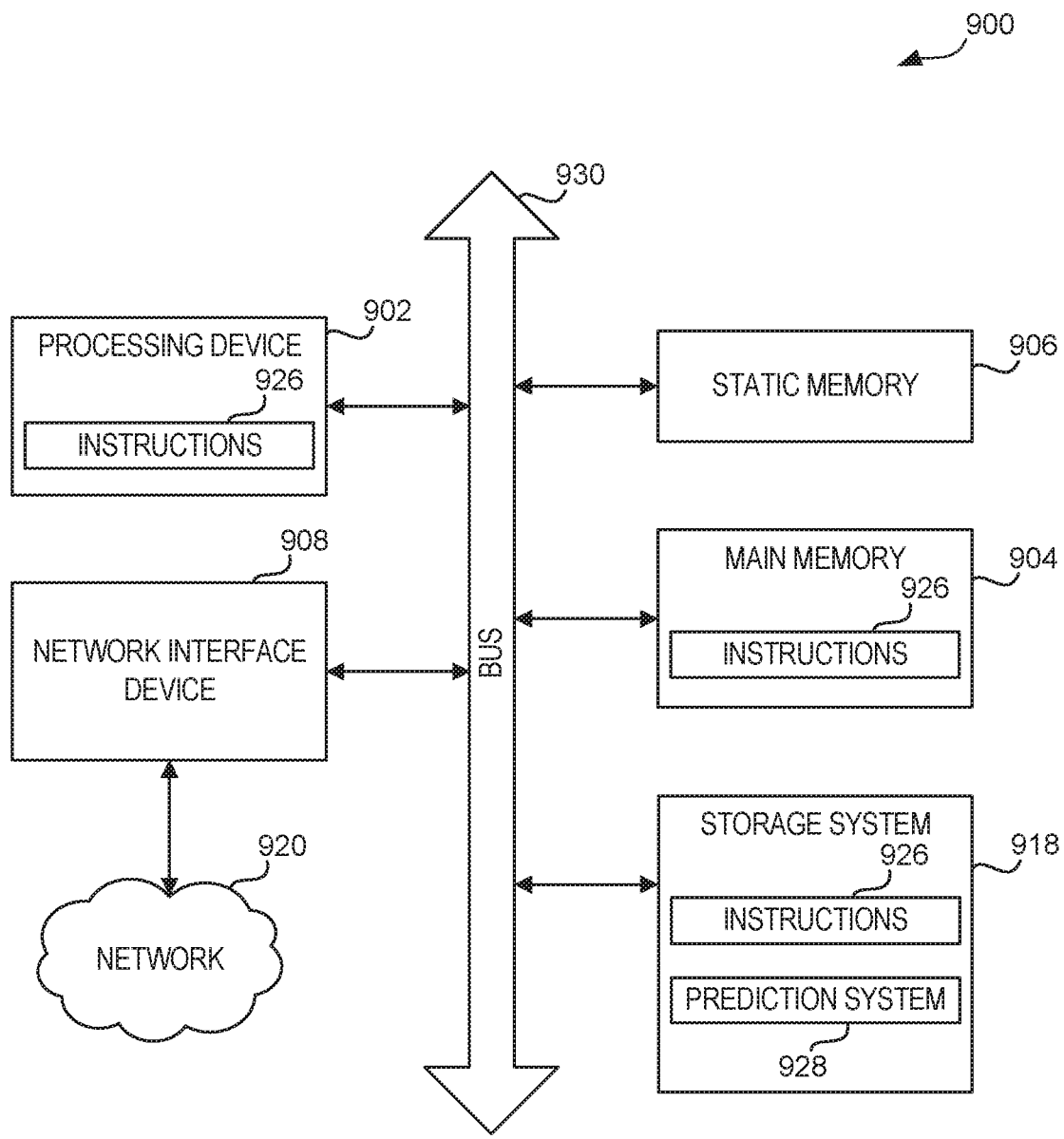
FIG. 9 illustrates an example a computer system having a data host system and storage device to perform any one or more of the processes or techniques discussed herein, in accordance with examples of the present disclosure.

FIG. 9 illustrates an example a computer system 900 having a data host system and storage device to perform any one or more of the processes or techniques discussed herein, in accordance with examples of the present disclosure. The computer system 900 can be an example of the computing system 100 (FIG. 1) or the host device 105, while the storage device 918 can be an example to the storage device 130 (FIG. 1).

In alternative embodiments, the machine 900 can operate as a standalone device or can be connected (e.g., networked) to other machines. In a networked deployment, the machine 900 can operate in the capacity of a server machine, a client machine, or both in server-client network environments. In an example, the machine 900 can act as a peer machine in peer-to-peer (P2P) (or other distributed) network environment. The machine 900 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that may, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system, a host system, etc.) 900 can include a processing device 902 (e.g., a hardware processor, a central processing unit (CPU), a graphics processing unit (GPU), a hardware processor core, or any combination thereof, etc.), a main memory 904 (e.g., read-only memory (ROM), dynamic random-access memory (DRAM) such as synchronous DRAM (SDRAM) or Rambus DRAM (RDRAM), etc.), a static memory 906 (e.g., static random-access memory (SRAM), etc.), and a storage system 918, some or all of which can communicate with each other via a communication interface (e.g., a bus) 930.

The processing device 902 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 902 can also be one or more special-purpose processing devices such as an application specific integrated circuit (ASIC), a field programmable gate array (FPGA), a digital signal processor (DSP), network processor, or the like. The processing device 902 can be configured to execute instructions 926 for performing the operations and steps discussed herein. The computer system 900 can further include a network interface device 908 to communicate over a network 920.

The storage system 918 can include a machine-readable storage medium (also known as a computer-readable medium) on which is stored one or more sets of instructions 926 or software embodying any one or more of the methodologies or functions described herein. The storage system 918 can also include prediction system 928, which can be configured according to the techniques and methodologies of the present disclosure, such as perform the operations of the prediction system 190, 500, or 600. The instructions 926 can also reside, completely or at least partially, within the main memory 904 or within the processing device 902 during execution thereof by the computer system 900, the main memory 904 and the processing device 902 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 900 can further include a display unit, an alphanumeric input device (e.g., a keyboard), and a user interface (UI) navigation device (e.g., a mouse). In an example, one or more of the display unit, the input device, or the UI navigation device can be a touch screen display. The machine a signal generation device (e.g., a speaker), or one or more sensors, such as a global positioning system (GPS) sensor, compass, accelerometer, or one or more other sensor. The machine 900 can include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 926 (e.g., software, programs, an operating system (OS), etc.) or other data are stored on the storage system 918 can be accessed by the main memory 904 for use by the processing device 902. The main memory 904 (e.g., DRAM) is typically fast, but volatile, and thus a different type of storage than the storage system 918 (e.g., an SSD), which is suitable for long-term storage, including while in an "off" condition. The instructions 926 or data in use by a user or the machine 900 are typically loaded in the main memory 904 for use by the processing device 902. When the main memory 904 is full, virtual space from the storage system 918 can be allocated to supplement the main memory 904; however, because the storage system 918 device is typically slower than the main memory 904, and write speeds are typically at least twice as slow as read speeds, use of virtual memory can greatly reduce user experience due to storage system latency (in contrast to the main memory 904. e.g., DRAM). Further, use of the storage system 918 for virtual memory can greatly reduce the usable lifespan of the storage system 918.

The instructions 924 can further be transmitted or received over a network 920 using a transmission medium via the network interface device 908 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®). IEEE 802.15.4 family of standards, peer-to-peer (P2P) networks, among others. In an example, the network interface device 908 can include one or more physical jacks (e.g., Ethernet, coaxial, or phone jacks) or one or more antennas to connect to the network 920. In an example, the network interface device 908 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 900, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code can form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Example 1 is a computing system comprising: a storage system comprising: a storage device comprising a non-volatile memory, and a host device that is configured to issue memory access commands to the storage device; and a prediction system comprising processing circuitry including one or more processors, the processing circuitry configured to perform operations that cause the prediction system to: identify one or more components of the storage system that limit random read performance of the storage system, obtain characterization data that is indicative of the impact of the one or more components on random read performance, generate a model based on the characterization data to predict random read performance of the storage system, execute the model in a simulation of the storage system to generate a random read performance parameter for the storage system, and adjust, based on the random read performance parameter, a configuration of a component of the computing system to achieve a target random read performance.

In Example 2, the subject matter of Example 1 includes, the processing circuitry is further configured to perform operations that cause the prediction system to: determine whether the random read performance parameter achieves a performance threshold; adjust a configuration of first component of the one or more components based on the determination; obtain second characterization data that is indicative of the impact of the first component the on random read performance; update the model based on the second characterization data; and execute the updated model in a simulation of the storage system to generate an updated random read performance parameter for the storage system.

In Example 3, the subject matter of Examples 1-2 includes, the processing circuitry is further configured to perform operations that cause the prediction system to: adjust a configuration of first component of the one or more components based on the determination; obtain second characterization data that is indicative of the impact of the first component the on random read performance; update the model based on the second characterization data; and execute the updated model in a simulation of the storage system to generate an updated random read performance parameter for the storage system; and determine, based on the random read performance parameter and the updated random read performance parameter, whether the first component is a has at least a threshold effect on the predicted random read performance.

In Example 4, the subject matter of Examples 1-3 includes, wherein the characterization data is indicative of a configuration of the one or more components, and the processing circuitry is further configured to perform operations that cause the system to: determine whether the random read performance parameter achieves a performance threshold; and cause, based on the determination, presentation of the configuration of the one or more components.

In Example 5, the subject matter of Examples 1-4 includes, wherein the one or more components comprise the non-volatile memory, and characterization data is indicative of at least one of an impact of a device level parallelism feature of the non-volatile memory on random read performance.

In Example 6, the subject matter of Examples 1-5 includes, wherein the one or more components comprise a data communication bus that couple storage device to the host device, and the characterization data is indicative of an impact of contention for access to the data communication bus on the random read performance.

In Example 7, the subject matter of Examples 1-6 includes, wherein one or more components comprise a command queue depth of the host device, and the characterization data is indicative of an impact of non-volatile memory die utilization due to the command queue depth on the random read performance.

In Example 8, the subject matter of Examples 1-7 includes, wherein the storage device comprises a storage controller, and the one or more components comprise an address translation cache of the storage controller, and the characterization data is indicative of an impact of a size of the address translation cache on the random read performance.

In Example 9, the subject matter of Examples 1-8 includes, wherein the storage device comprises a storage controller, and the one or more components comprise storage controller firmware overhead, and the characterization data is indicative of an impact of a random read latency caused by the storage controller firmware overhead on the random read performance.

Example 10 is a method for operating a computing system to predict random read performance of a storage system, the method comprising: identifying one or more components of the storage system that limit random read performance of the storage system; obtaining characterization data that is indicative of the impact of the one or more components on random read performance; generating a model based on the characterization data to predict random read performance of the storage system; and executing the model in a simulation of the storage system to generate a random read performance parameter for the storage system.

In Example 11, the subject matter of Example 10 includes, determining whether the random read performance parameter achieves a performance threshold; adjusting a configuration of first component of the one or more components based on the determination; obtaining second characterization data that is indicative of the impact of the first component the on random read performance; updating the model based on the second characterization data; and executing the updated model in a simulation of the storage system to generate an updated random read performance parameter for the storage system.

In Example 12, the subject matter of Examples 10-11 includes, adjusting a configuration of first component of the one or more components based on the determination; obtaining second characterization data that is indicative of the impact of the first component the on random read performance; updating the model based on the second characterization data; and executing the updated model in a simulation of the storage system to generate an updated random read performance parameter for the storage system; and determining, based on the random read performance parameter and the updated random read performance parameter, whether the first component is a has at least a threshold effect on the predicted random read performance.

In Example 13, the subject matter of Examples 10-12 includes, wherein the characterization data is indicative of a configuration of the one or more components, and the method further comprises: determining whether the random read performance parameter achieves a performance threshold; and cause, based on the determination, presentation of the configuration of the one or more components.

In Example 14, the subject matter of Examples 10-13 includes, wherein the one or more components comprise the non-volatile memory, and characterization data is indicative of at least one of an impact of a device level parallelism feature of the non-volatile memory on random read performance.

In Example 15, the subject matter of Examples 10-14 includes, wherein the one or more components comprise a data communication bus that couple storage device to the host device, and the characterization data is indicative of an impact of contention for access to the data communication bus on the random read performance.

In Example 16, the subject matter of Examples 10-15 includes, wherein one or more components comprise a command queue depth of the host device, and the characterization data is indicative of an impact of non-volatile memory die utilization due to the command queue depth on the random read performance.

In Example 17, the subject matter of Examples 10-16 includes, wherein the storage device comprises a storage controller, and the one or more components comprise an address translation cache of the storage controller, and the characterization data is indicative of an impact of a size of the address translation cache on the random read performance.

Example 18 is a device readable storage medium that provides instructions that, when executed by a processor of a host device cause the processor to perform operations comprising: identifying one or more components of the storage system that limit random read performance of the storage system; obtaining characterization data that is indicative of the impact of the one or more components on random read performance; generating a model based on the characterization data to predict random read performance of the storage system; and executing the model in a simulation of the storage system to generate a random read performance parameter for the storage system.

In Example 19, the subject matter of Example 18 includes, the operations further comprising: determining whether the random read performance parameter achieves a performance threshold; adjusting a configuration of first component of the one or more components based on the determination; obtaining second characterization data that is indicative of the impact of the first component the on random read performance; updating the model based on the second characterization data; and executing the updated model in a simulation of the storage system to generate an updated random read performance parameter for the storage system.

In Example 20, the subject matter of Examples 18-19 includes, the operations further comprising: adjusting a configuration of first component of the one or more components based on the determination; obtaining second characterization data that is indicative of the impact of the first component the on random read performance; updating the model based on the second characterization data; and executing the updated model in a simulation of the storage system to generate an updated random read performance parameter for the storage system; and determining, based on the random read performance parameter and the updated random read performance parameter, whether the first component is a has at least a threshold effect on the predicted random read performance.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

In Example 25, any of the computing systems of Examples 1 to 9, may be adapted and operated to perform operations in accordance with any of the methods of Examples 10-17.

In Example 26, any of the methods of Examples 10 to 17, may be incorporated into an electronic system further comprising a host processor and a communication bus extending between the host processor and a memory device.

In Example 27 any of the device readable storage mediums of examples 18-20 may be modified to include any structure presented in another of Examples 1-9.

In Example 28, any of the methods of Examples 10-17 may be performed by an electronic system including a host processor and a communications bus extending between the host processor and a memory device.

In Example 29 any of the methods of Examples 10-17 may be modified to include operations set forth in any other of Examples 18-20.

In Example 30, any of the methods of examples 10-17, 28 or 29 may be implemented at least in part through use of instructions stored as a physical state in one or more machine readable storage devices.

What is claimed is:

1. A computing system comprising:
   a storage system comprising:
      a storage device comprising a non-volatile memory;
      a host device that is configured to issue memory access commands to the storage device; and
      a prediction system comprising processing circuitry including one or more processors, the processing circuitry configured to perform operations that cause the prediction system to:
         identify one or more components of the storage system that limit random read performance of the storage system,
         obtain characterization data that is indicative of the impact of the one or more components on random read performance,
         generate a model based on the characterization data to predict random read performance of the storage system,
         execute the model to simulate operation of the one or more components of the storage system and to generate a predicted random read performance parameter for the storage system, and
         adjust, based on the predicted random read performance parameter; a configuration of a component of the computing system to achieve a target random read performance.

2. The computing system of claim 1, the processing circuitry is further configured to perform operations that cause the prediction system to:
   determine whether the predicted random read performance parameter achieves a performance threshold;
   adjust a configuration of first component of the one or more components based on the determination;
   obtain second characterization data that is indicative of the impact of the first component on the random read performance;
   update the model based on the second characterization data; and
   execute the updated model in a simulation of the storage system to generate an updated random read performance parameter for the storage system.

3. The computing system of claim 1, the processing circuitry is further configured to perform operations that cause the prediction system to:
   adjust a configuration of a first component of the one or more components based on the predicted random read performance parameter;
   obtain second characterization data that is indicative of the impact of the first component on the random read performance;
   update the model based on the second characterization data;
   execute the updated model to simulate operation of the first component of the storage system and to generate an updated predicted random read performance parameter for the storage system; and
   determine, based on the predicted random read performance parameter and the updated predicted random read performance parameter, whether the first component has at least a threshold effect on the predicted random read performance.

4. The computing system of claim 1, wherein the characterization data is indicative of a configuration of the one or more components, and the processing circuitry is further configured to perform operations that cause the system to:
   determine whether the predicted random read performance parameter achieves a performance threshold; and
   cause, based on the determination, presentation of the configuration of the one or more components.

5. The computing system of claim 1, wherein the one or more components comprise the non-volatile memory, and characterization data is indicative of at least one of an impact of a device level parallelism feature of the non-volatile memory on random read performance.

6. The computing system of claim 1, wherein the one or more components comprise a data communication bus that couple storage device to the host device, and the characterization data is indicative of an impact of contention for access to the data communication bus on the random read performance.

7. The computing system of claim 1, wherein one or more components comprise a command queue depth of the host device, and the characterization data is indicative of an impact of non-volatile memory die utilization due to the command queue depth on the random read performance.

8. The computing system of claim 1, wherein the storage device comprises a storage controller, and the one or more components comprise an address translation cache of the storage controller, and the characterization data is indicative of an impact of a size of the address translation cache on the random read performance.

9. The computing system of claim 1, wherein the storage device comprises a storage controller, and the one or more components comprise storage controller firmware overhead, and the characterization data is indicative of an impact of a random read latency caused by the storage controller firmware overhead on the random read performance.

10. A method for operating a computing system to predict random read performance of a storage system, the method comprising:
- identifying one or more components of the storage system that limit random read performance of the storage system;
- obtaining characterization data that is indicative of the impact of the one or more components on random read performance;
- generating a model based on the characterization data to predict random read performance of the storage system;
- executing the model to simulate operation of the one or more components of the storage system and to generate a predicted, random read performance parameter for the storage system; and
- adjusting, based on the predicted random read performance parameter, a configuration of a component of the computing system to achieve a target random read performance.

11. The method of claim 10, further comprising:
- determining whether the predicted random read performance parameter achieves a performance threshold;
- adjusting a configuration of first component of the one or more components based on the determination;
- obtaining second characterization data that is indicative of the impact of the first component on the random read performance;
- updating the model based on the second characterization data; and
- executing the updated model in a simulation of the storage system to generate an updated random read performance parameter for the storage system.

12. The method of claim 10, further comprising:
- adjusting a configuration of a first component of the one or more components based on the predicted random read performance parameter;
- obtaining second characterization data that is indicative of the impact of the first component on the random read performance;
- updating the model based on the second characterization data;
- executing the updated model to simulate operation of the first component of the storage system and to generate an updated predicted random read performance parameter for the storage system; and
- determining, based on the predicted random read performance parameter and the updated predicted random read performance parameter, whether the first component has at least a threshold effect on the predicted random read performance.

13. The method of claim 10, wherein the characterization data is indicative of a configuration of the one or more components, and the method further comprises:
- determining whether the predicted random read performance parameter achieves a performance threshold; and
- cause, based on the determination, presentation of the configuration of the one or more components.

14. The method of claim 10, wherein the one or more components comprise anon-volatile memory, and the characterization data is indicative of an impact of a device level parallelism feature of the non-volatile memory on random read performance.

15. The method of claim 10, wherein the one or more components comprise a data communication bus that couples the storage system to a host device, and the characterization data is indicative of an impact of contention for access to the data communication bus on the random read performance.

16. The method of claim 10, wherein the one or more components comprise a command queue depth of a host device, and the characterization data is indicative of an impact of non-volatile memory die utilization due to the command queue depth on the random read performance.

17. The method of claim 10, wherein the storage system comprises a storage controller, and the one or more components comprise an address translation cache of the storage controller, and the characterization data is indicative of an impact of a size of the address translation cache on the random read performance.

18. A non-transitory device readable storage medium that provides instructions that, when executed by a processor of a host device cause the processor to perform operations comprising:
- identifying one or more components of a storage system that limit random read performance of the storage system;
- obtaining characterization data that is indicative of the impact of the one or more components on random read performance;
- generating a model based on the characterization data to predict random read performance of the storage system;
- executing the model to simulate operation of the one or more components of the storage system and to generate a predicted random read performance parameter for the storage system; and
- adjust, based on the predicted random read performance parameter, a configuration of a component of the storage system to achieve a target random read performance.

19. The non-transitory device readable storage medium of claim 18, the operations further comprising:
- determining whether the predicted random read performance parameter achieves a performance threshold;
- adjusting a configuration of first component of the one or more components based on the determination;
- obtaining second characterization data that is indicative of the impact of the first component on the random read performance;
- updating the model based on the second characterization data; and
- executing the updated model in a simulation of the storage system to generate an updated random read performance parameter for the storage system.

20. The non-transitory device readable storage medium of claim 18, the operations further comprising:
- adjusting a configuration of a first component of the one or more components based on the predicted random read performance parameter;
- obtaining second characterization data that is indicative of the impact of the first component on the random read performance;
- updating the model based on the second characterization data;

executing the updated model to simulate operation of the first component of the storage system and to generate an updated predicted random read performance parameter for the storage system; and determining, based on the predicted random read performance parameter and the updated predicted random read performance parameter, whether the first component has at least a threshold effect on the predicted random read performance.

* * * * *